United States Patent
Butler et al.

(10) Patent No.: US 7,944,139 B2
(45) Date of Patent: May 17, 2011

(54) LIGHT EMITTING DEVICE

(75) Inventors: Timothy Butler, Cambridge (GB); Nalinkumar Patel, Cambridge (GB); Matthew Roberts, Cambridge (GB); Nicholas Baynes, Hope Valley (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 184 days.

(21) Appl. No.: 11/664,543

(22) PCT Filed: Oct. 7, 2005

(86) PCT No.: PCT/GB2005/003864
§ 371 (c)(1), (2), (4) Date: Apr. 25, 2008

(87) PCT Pub. No.: WO2006/038020
PCT Pub. Date: Apr. 13, 2006

(65) Prior Publication Data
US 2008/0258606 A1    Oct. 23, 2008

(30) Foreign Application Priority Data

Oct. 8, 2004    (GB) .................................. 0422391.3

(51) Int. Cl.
*H01J 1/62* (2006.01)
*H01J 63/04* (2006.01)

(52) U.S. Cl. ........................................ 313/504; 313/506

(58) Field of Classification Search .................. 313/504, 313/506; 428/690; 257/40
See application file for complete search history.

(56) References Cited

U.S. PATENT DOCUMENTS

| 6,633,122 | B2 * | 10/2003 | Kijima et al. ................. 313/506 |
| 6,953,628 | B2 | 10/2005 | Kamatani et al. |
| 6,995,509 | B2 * | 2/2006 | Yamazaki et al. ............ 313/504 |
| 7,030,138 | B2 | 4/2006 | Fujimoto et al. |
| 7,094,477 | B2 | 8/2006 | Kamatani et al. |
| 7,125,998 | B2 | 10/2006 | Stossel et al. |
| 7,147,935 | B2 | 12/2006 | Kamatani et al. |
| 2002/0117662 | A1 | 8/2002 | Nii |

(Continued)

FOREIGN PATENT DOCUMENTS

EP    1 245 659 A1    10/2002

(Continued)

OTHER PUBLICATIONS

Adachi et al., "High-Efficiency Organic Electrophosphorescent Devices with Tris(2-phenylpyridine)iridium Doped into Electron-Transporting Materials," *Appl. Phys. Lett.*, 77(6):904-906 (2000).

(Continued)

*Primary Examiner* — Nimeshkumar D Patel
*Assistant Examiner* — Glenn Zimmerman
(74) *Attorney, Agent, or Firm* — Marshall, Gerstein & Borun LLP

(57) ABSTRACT

A light-emitting device comprising: an anode; a cathode; and a light emitting region situated between the anode and the cathode, the light emitting region comprising an exciton generating layer and a phosphorescent layer, the exciton generating layer comprising an organic material, wherein the organic material of the exciton generating layer generates singlet and triplet excitons and emits light by fluorescent emission from the singlet excitons and the phosphorescent layer accepts the triplet excitons from the exciton generating layer and emits light by phosphorescent emission from the triplet excitons.

16 Claims, 2 Drawing Sheets

U.S. PATENT DOCUMENTS

| | | | |
|---|---|---|---|
| 2002/0182441 A1 | 12/2002 | Lamansky et al. | |
| 2002/0197511 A1* | 12/2002 | D'Andrade et al. | 428/690 |
| 2004/0124766 A1* | 7/2004 | Nakagawa et al. | 313/504 |
| 2004/0165102 A1* | 8/2004 | Komatsu et al. | 348/370 |
| 2005/0123788 A1* | 6/2005 | Huo et al. | 428/690 |
| 2005/0260439 A1* | 11/2005 | Shiang et al. | 428/690 |
| 2006/0063026 A1* | 3/2006 | Holmes et al. | 428/690 |
| 2006/0220004 A1* | 10/2006 | Stossel et al. | 257/40 |
| 2006/0279203 A1* | 12/2006 | Forrest et al. | 313/504 |

FOREIGN PATENT DOCUMENTS

| | | |
|---|---|---|
| JP | 2002-324679 | 11/2002 |
| WO | WO-99/21935 | 5/1999 |
| WO | WO-99/54385 | 10/1999 |
| WO | WO-02/44189 | 6/2002 |
| WO | WO-02/45466 | 6/2002 |
| WO | WO-02/066552 | 8/2002 |
| WO | WO-02/067343 | 8/2002 |
| WO | WO-02/068435 | 9/2002 |
| WO | WO-02/081448 | 10/2002 |
| WO | WO-02/091814 | 11/2002 |
| WO | WO-03/091355 | 11/2003 |
| WO | WO-03/095586 | 11/2003 |
| WO | WO-2004/023573 | 3/2004 |

OTHER PUBLICATIONS

D'Andrade et al., "Controlling Exciton Diffusion in Multilayer White Phosphorescent Organic Light Emitting Devices," *Adv. Mat.*, 14(2):147-151 (2002).

Deshpander et al., "White-Light-Emitting Organic Electroluminescent Devices Based on Interlayer Sequential Energy Transfer," *Appl. Phys. Lett.*, 75(7):888-890 (1999).

Duggal et al., "Organic Light-Emitting Devices for Illumination Quality White Light," *Appl. Phys. Lett.*, 80(19):3470-3472 (2002).

Tokito et al., "High Efficiency White Phosophorescent Organic Light-Emitting Devices with Greenish-Blue and Red-Emitting Layers," *Appl. Phys. Lett.*, 83(12):2459-2461 (2003).

Tsuji et al., "Nondoped-Type White Organic Electroluminescent Devices Utilizing Complementary Color and Exciton Diffusion," *Appl. Phys. Lett.*, 81(18):3329-3331 (2002).

Wohlgenannt et al., "Formation Cross-Sections of Singlet and Triplet Excitons in $\pi$-Conjugated Polymers," *Nature*, 409:494-497 (2001).

Wohlgenannt et al., "Photophysics Properties of Blue-Emitting Polymers," *Synth. Met.*, 125(1):55-63 (2001).

Brown et al., "Optical Spectroscopy of Triplet Excitons and Charged Excitations in Poly(p-phenylenevinylene) Light-Emitting Diodes," *Chem. Phys. Lett.*, 210(1-3):61-66 (1993).

Combined Search and Examination Report for Application No. GB0422391.3, dated Jan. 21, 2005.

International Search Report and Written Opinion for International Application No. PCT/GB2005/003864, dated Jan. 19, 2006.

International Preliminary Report on Patentability for International Application No. PCT/GB2005/003864, dated Apr. 11, 2007.

\* cited by examiner

LIGHT EMITTING DEVICE

Luminescent conjugated polymers are a new technologically important class of materials that will be used in light emitting display devices for the next generation of information technology based consumer products. The principle interest in the use of polymers, as opposed to inorganic semiconducting and organic dye materials, lies in the scope for low-cost manufacturing, using solution-processing of film-forming materials. Since the last decade much effort has been devoted to the improvement of the emission efficiency of organic light emitting diodes (OLEDs) either by developing highly efficient materials or efficient device structures.

In OLEDs, electrons and holes are injected from opposite electrodes and are combined to form two types of excitons; spin-symmetric triplets and spin-antisymmetric singlets in a theoretical ratio of 3:1. Radiative decay from the singlets is fast (fluorescence), but from the triplets (phosphorescence) it is formally forbidden by the requirement of the spin conservation.

Initially spurred on by this understanding that the maximum internal quantum efficiency of a fluorescent OLED was limited to 25% the idea of transferring both singlets and triplets to a phosphorescent dopant was conceived. Such a phosphor typically is able to accept both singlet and triplet excitons from the organic material and generate luminescence, particularly electroluminescence from both.

In the past few years many have studied the incorporation by blending of phosphorescent materials into a semiconductive layer. In particular, this has been applied to white light emitting devices.

There have been several approaches to obtaining efficient white light emission. In order to make white light of sufficient quality for general illumination it is usually necessary to combine light from a number of different emitters. For example blue plus yellow or blue plus green plus red. Many potential schemes for doing this suffer from differential aging where for example the quantity of blue light decays more rapidly than the other colours. One method to avoid differential aging is to use down-conversion techniques. In "down-conversion" there is one fundamental source producing photons of the highest required energy. Some or all of these photons are then absorbed by materials known in the art as "phosphors" and re-emitted as lower energy (longer wavelength) radiation. It will be understood by the skilled person that, despite their name, these down-converting "phosphors" may re-emit absorbed light as fluorescent or phosphorescent radiation.

The standard fluorescent tube is an example of the use of down-conversion to generate illumination-quality white light. In this case the source of the photons is a mercury discharge, giving mainly blue light. Phosphors on the surface of the glass tube convert some of these photons to the yellow area of the spectrum and the combination of blue plus yellow is perceived as white. The fluorescent tubes can not be used in flat panel displays and so more recent OLEDs represent a significant advantage over these.

Applied Physics Letters 80(19), 3470-3472, 2002 discloses another approach; using an organic light emitting polymer device comprising an electroluminescent material that emits blue fluorescence. Phosphors or dyes external to the organic device absorb some of the "blue" photons and re-emit photons of lower energy, thereby "down converting" some of the blue emission to yellow. The blue and yellow emissions combine to form white emission.

As with most if not all luminescent materials, the blue electroluminescent material of this device generates both singlet and triplet excitons. However all emission in this device (i.e. blue and downconverted yellow) derives from the blue emission of the electroluminescent material which in turn is derived from singlet excitons, i.e. the triplets excitons generated by the blue electroluminescent material are not harvested. The ratio of singlet excitons to triplet excitons can be as high as 1:3 (as discussed in, for example, Chem. Phys. Lett., 1993, 210, 61, Nature (London), 2001, 409, 494, Synth. Met., 2002, 125, 55 and references therein). Consequently, the theoretical maximum efficiency of this device may be as low as 25%.

One example of a white phosphorescent device is disclosed in Advanced Materials, 2002, 14, No. 2, "Controlling Exciton Diffusion in Multilayer White Phosphorescent Organic Light Emitting Devices". This disclosure is concerned with a white organic light emitting device. It is said that white organic light emitting devices (WOLEDs) are of interest because they offer low-cost alternatives for backlights in flat-panel displays, and may eventually find use in lighting. It is further said that white light emission can be obtained from multilayer OLED structures in which different layers emit different parts of the visible spectrum, from single layer polymer blends, or from hybrid organic/inorganic structures, white light-emitting materials, or exciplexes.

Advanced Materials 2002, 14, No. 2 reports the use of blue (6 wt. % FIrpic:CBP), yellow (8 wt. % Bt2Ir(acac):BCP), and red (8 wt. % Btp2Ir(acac):CBP) phosphor doped emissive regions combined in two multi layer OLEDs to efficiently produce white light. The two device structures are as follows:

1—Substrate/ITO anode/PEDOT:PSS/Hole Transport Layer (HTL) NPD/Blue Emissive Region (EMR)/Red EMR/Yellow EMR/BCP/Cathode; and 2—Substrate/ITO anode/PEDOT:PSS/Hole Transport Layer (HTL) NPD/Blue Emissive Region (EMR)/blocker (BCP)/Red EMR/BCP/Cathode.

The compounds FIrpic and Bt2Ir(acac) emit by absorbing singlet and triplet excitons and emitting from a triplet molecular excited state (phosphorescence). These phosphorescent devices have higher efficiency than the aforementioned fluorescent device as a result of triplet excitons being harvested. However, these devices suffer from two drawbacks. Firstly, the blue emission from a phosphorescent compound requires a high triplet energy level and a yet higher triplet energy level dopant. These are particularly demanding requirements and in consequence blue emission from FIrpic is relatively poor as compared to blue as defined by 1931 CIE co-ordinates. Secondly, the colours of the two emissive species change over device lifetime and in consequence colour stability of these devices is a problem.

According to Advanced Materials 2002, 14, No. 2 the control of the diffusion of triplet excitons provides a means for obtaining the desired colour balance. It should be noted that triplets have lifetimes that are several orders of magnitude longer than singlets, hence they have longer diffusion lengths, allowing emissive layers to be >10 nm thick.

By varying the concentration of the dopants, the location of the different colour regions with respect to the HTL interface (where exciton formation occurs), and the thicknesses of each of the layers, Advanced Materials 2002, 14, No. 2 teaches that the CIE coordinates of the OLED emission can be tuned over a wide range.

In device 2 the blocker is a thin BCP, hole/exciton blocking layer placed between the FIrpic and Bt2Ir(acac) doped layers. It is said that this layer retards the flow of holes from the FIrpic doped layer towards the cathode and thereby forces more excitons to form in the FIrpic layer, and it prevents excitons from diffusing towards the cathode after forming in the FIrpic doped layer.

The host-dopant systems used in the emissive regions in device 1 and device 2 in Advanced Materials 2002, 14, No. 2 are not solution processable. Further, the blue EMR does not give blue light with adequate colour and efficiency to exceed the performance of white devices based on fluorescent blue plus external down-conversion.

In view of the above, it will be appreciated that there exists a need to provide an efficient white organic light-emitting device (WOLED), which preferably is solution processable.

It is an aim of the present invention therefore to provide a new organic light-emitting device, and particularly a new WOLED.

The present invention at least partially addresses this need by providing a light-emitting device comprising an anode; a cathode; and a light emitting region situated between the anode and the cathode, said light emitting region comprising an exciton generating layer and a phosphorescent layer, the exciton generating layer comprising an organic material, wherein the organic material of the exciton generating layer generates singlet and triplet excitons and emits light by fluorescent emission from the singlet excitons and the phosphorescent layer accepts the triplet excitons from the exciton generating layer and emits light by phosphorescent emission from the triplet excitons.

In the present device, it will be understood that singlet and triplet excitons are generated from a single source; the organic material of the exciton generating layer. However, the singlet excitons decay to generate light from a different material than the triplet excitons. Thus, light is generated from two sources; the organic material of the exciton generating layer, which harvests the singlet excitons, and the phosphorescent layer, which harvests the triplet excitons.

The triplet excitons migrate from the exciton generating layer to the phosphorescent layer. This may be accomplished, for example, by (1) having a singlet blocking layer; or (2) by ensuring that only triplets can diffuse far enough to reach the phosphorescent layer. These two embodiments of the present invention are discussed further below.

The exciton generating layer emits light directly by fluorescent emission from the singlet excitons. The triplet excitons diffuse into the phosphorescent layer where they give rise to emission via phosphorescence.

It will be appreciated that the device structure according to the present invention may be used to generate light across a wide spectrum of colours. This can be achieved, for example, by appropriate selection of the thickness and composition of the exciton generating layer and the thickness and composition of the phosphorescent layer. It has been found that the present device is particularly advantageous for producing white light.

For the purpose of white light illumination, the colour of emission should be equivalent to that of a black-body emitter between 3000 and 8000 K, preferably 6000-7000 K. In order for the device to emit white light, preferably, the exciton generating layer comprises a blue light-emitting material and the phosphorescent layer comprises a yellow light-emitting material. Blue light may be characterised by CIE coordinates in the range x<0.3, y<0.3. Yellow light may be characterised by CIE coordinates in the range x>0.3, y>0.3.

CIE coordinates are derived from the spectrum of emitted light I(□). First Tristimulus values X, Y, Z are calculated from the overlap of the emitted spectrum with standard CIE observer functions:

$$X = \int_{380}^{780} I(\lambda)\bar{x}(\lambda)d\lambda \text{ and similar for } Y \text{ and } Z$$

then the CIE coordinates (x and y) are calculated using:

$$x=X/(X+Y+Z) \text{ and } y=Y/(X+Y+Z)$$

The present device is advantageous in that it may be used to make illumination sources flat panel displays. Further, the device will have a high efficiency because it harvests both triplet excitons and singlet excitons. Still further, the present device has been found to have good colour stability with time, i.e. in the case of a white emitting device, the colour of emission remains equivalent to that of a black body emitter at between 3000 and 6000 K. Thus, the present invention combines the efficiency advantage of phosphorescence with the colour stability advantage of using one chemical moiety as the source of the excited states which give rise to light emission. Advantageously, the present device also can be manufactured at a low cost by solution processing of film forming materials.

The exciton generating layer comprises an organic material. The organic material of the exciton generating layer may be any suitable material. The organic material of the exciton generating layer preferably comprises a polymer. Preferably, the polymer comprises a triarylamine repeat unit. Particularly preferred triarylamine repeat units are shown in formulae 1-6:

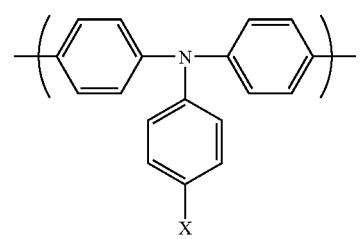

1

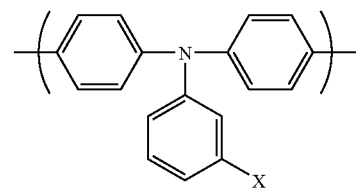

2

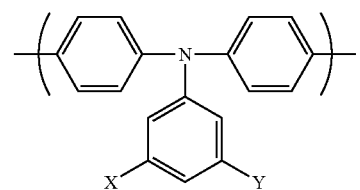

3

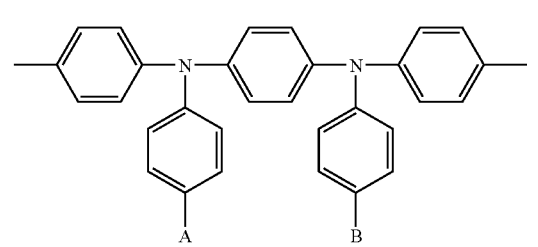

4

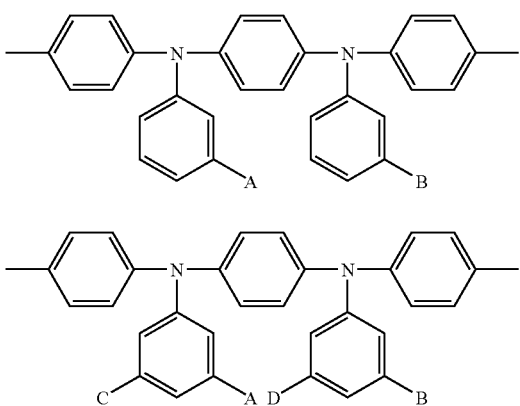

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are $C_{1-10}$ alkyl. The repeat unit of formula 1 is most preferred.

wherein X, Y, A, B, C and D are independently selected from H or a substituent group. More preferably, one or more of X, Y, A, B, C and D is independently selected from the group consisting of optionally substituted, branched or linear alkyl, aryl, perfluoroalkyl, thioalkyl, cyano, alkoxy, heteroaryl, alkylaryl and arylalkyl groups. Most preferably, X, Y, A and B are C1-10 alkyl. The repeat unit of formula 1 is most preferred.

Most preferably, the polymer is a copolymer comprising one or more repeat units of formulae 1-6 and an arylene repeat unit. Particularly preferred arylene repeat units are optionally substituted fluorene, spirofluorene, indenofluorene, phenylene and oligophenylene repeat units.

In another embodiment, the organic material of the exciton generating layer may comprise a small molecule such as tris(8-hydroxyquinoline)aluminium (Alq3). In still another embodiment, the organic material may comprise a dendrimer, for example a dendrimer comprising a blue emissive core and arylene vinylene dendrons as disclosed in WO 99/21935 or arylene dendrons as disclosed in WO 02/067343.

The exciton generating layer may comprise the afore-mentioned organic material alone or it may be blended with one or more charge transporting compounds.

Preferably, the organic material of the exciton generating layer is a blue fluorescent material, which gives rise to blue light emission having CIE coordinates x<0.3, y<0.3

The exciton generating layer may be deposited during device manufacture by any suitable technique. For example, the exciton generating layer may be deposited by solution processing.

The phosphorescent layer comprises the phosphorescent material and a host material. The phosphorescent material is dispersed in the host material to avoid phosphorescence quenching that occurs at high phosphorescent material concentration. The host material may be an inert material however it is preferably capable of transporting charge. In the case where the phosphorescent layer is located between exciton generating layer and the cathode, the host material is preferably a good electron transporter, i.e. the LUMO level of the host material is at most 0.1 eV deeper than the LUMO of the exciton generating layer, more preferably no deeper than the LUMO of the exciton generating layer, most preferably less deep than the LUMO of the exciton generating layer. Suitable electron transporting host materials include 2,9-dimethyl-4,7-diphenyl-phenanthroline (BCP), 1,3-bis(N,N-t-butylphenyl)-1,3,4-oxadiazole (OXD7), and 3-phenyl-4-(1-naphthyl)-5-phenyl-1,2,4-triazole (TAZ) as disclosed in, for example, Appl. Phys. Lett., 2000, 77(6) p. 904-906.

The host material may be blended with or chemically bound to the phosphorescent material.

In the phosphorescent layer, phosphorescence may be from a single emitter or may be from a combination of different emitters either blended together or present as distinct sub layers. In one embodiment, it is preferred that that the phosphorescent layer comprises a yellow phosphorescent material, which gives rise to yellow light emission having CIE coordinates x>0.3, y>0.3.

In another embodiment, it is preferred that the phosphorescent layer comprises a red phosphorescent material and a green phosphorescent material. A red phosphorescent material gives rise to red light emission having CIE coordinates x 0.55-0.7, y 0.45-0.30, preferably x 0.65, y 0.33. A green phosphorescent material gives rise to green light emission having CIE coordinates x 0.45-0.25, y 0.45-0.65, preferably x 0.3, y 0.6.

The phosphorescent layer preferably comprises a phosphorescent organic material, in particular a phosphorescent metal complex. Suitable metal complexes include complexes of formula (I):

$$ML1qL2rL3s \qquad (I)$$

wherein M is a metal; each of L1, L2 and L3 is a coordinating group (ligand); q is an integer; r and s are each independently 0 or an integer; and the sum of (a·q)+(b·r)+(c·s) is equal to the number of coordination sites available on M, wherein a is the number of coordination sites on L1, b is the number of coordination sites on L2 and c is the number of coordination sites on L3.

Heavy elements M induce strong spin-orbit coupling to allow rapid intersystem crossing and emission from triplet states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold.

The d-block metals form organometallic complexes with carbon or nitrogen donors such as porphyrin or bidentate ligands of formula (VI):

(VI)

wherein $Ar^4$ and $Ar^5$ may be the same or different and are independently selected from optionally substituted aryl or heteroaryl groups; $X^1$ and $Y^1$ may be the same or different and are independently selected from carbon or nitrogen; and $Ar^4$ and $Ar^5$ may be fused together. Ligands wherein $X^1$ is carbon and $Y^1$ is nitrogen are particularly preferred.

wherein Ar4 and Ar5 may be the same or different and are independently selected from optionally substituted aryl or heteroaryl groups; X1 and Y1 may be the same or different and are independently selected from carbon or nitrogen; and Ar4 and Ar5 may be fused together. Ligands wherein X1 is carbon and Y1 is nitrogen are particularly preferred.

Examples of bidentate ligands are illustrated below:

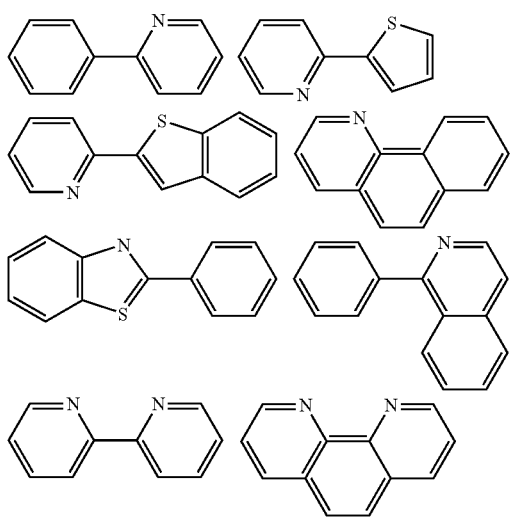

Each of Ar4 and Ar5 may carry one or more substituents. Particularly preferred substituents include fluorine or trifluoromethyl which may be used to blue-shift the emission of the complex as disclosed in WO 02/45466, WO 02/44189, US 2002-117662 and US 2002-182441; alkyl or alkoxy groups as disclosed in JP 2002-324679; carbazole which may be used to assist hole transport to the complex when used as an emissive material as disclosed in WO 02/81448; bromine, chlorine or iodine which can serve to functionalise the ligand for attachment of further groups as disclosed in WO 02/68435 and EP 1245659; and dendrons which may be used to obtain or enhance solution processability of the metal complex as disclosed in WO 02/66552.

The phosphorescent metal complex may also be present in a polymeric or oligomeric chain as disclosed in WO 03/091355, in which case the complex may be present as a single unit or a repeat unit located within, pendant from, or as an end group of, a polymeric or oligomeric chain.

Other ligands suitable for use with d-block elements include diketonates, in particular acetylacetonate (acac); triarylphosphines and pyridine, each of which may be substituted.

The phosphorescent layer may be deposited during device manufacture by any suitable technique. For example, the phosphorescent layer may be deposited by solution processing or vacuum evaporation.

Preferably the thickness of the phosphorescent layer is in the range of from 5 to 200 mm. More preferably, the thickness of the phosphorescent layer is in the range of from 10 to 50 nm.

In order for triplet excitons, which have diffused from the exciton generating layer, to be harvested by, and emit from, the phosphorescent material of the phosphorescent layer, the triplet energy level T1 of the phosphorescent layer preferably is no more than 0.1 eV greater than the T1 level of the exciton generating material. More preferably, the T1 level of the phosphorescent material is no greater than the T1 level of the exciton generating material. Most preferably, the T1 level of the phosphorescent material is lower than the T1 level of the exciton generating material.

According to a first embodiment, a singlet blocking layer is located between the exciton generating layer and the phosphorescent layer.

The singlet blocking layer inhibits diffusion of singlet excitons, thereby retaining them in the exciton generating layer. The singlet blocking layer allows the diffusion of triplet excitons therethrough without quenching them.

According to the first embodiment, preferably, the singlet blocking layer has its S1 (lowest energy level for singlet excitons) more than 0.1 eV higher than the S1 of the exciton generating layer. Also preferably, the singlet blocking layer has its T1 (lowest energy level for triplet excitons) not higher than that of the exciton generating layer. This is shown in FIG. 2.

A suitable material for the singlet blocking layer will be known to a person skilled in the art. A preferred material for the singlet blocking layer is stilbene.

The singlet blocking layer must be sufficiently thin that triplet excitons are capable of diffusing through it. Preferably the thickness of the singlet blocking layer is in the range of from 10 to 70 nm. More preferably, the thickness of the singlet blocking layer is in the range of from 20 to 50 nm.

The singlet blocking layer may be deposited during device manufacture by any suitable technique. For example, the singlet blocking layer may be deposited by solution processing.

In the first embodiment, it is preferred that the exciton generating layer is situated on the anode side of the device and the phosphorescent layer is situated on the cathode side of the device.

The exciton generating layer must be sufficiently thin that triplet excitons are able to diffuse through it. In the first embodiment, preferably the exciton generating layer is up to 50 nm thick.

According to a second embodiment, the device comprises a hole transporting layer with low electron mobility on which is formed an electron transporting, exciton generating layer with low hole mobility. This architecture is used to ensure that the recombination zone is close to the anode, with a sufficiently thick exciton generating layer so that singlet excitons can not diffuse as far as the phosphorescent layer due to their short half life. In the second embodiment, the thickness of the exciton generating layer is such that triplet excitons are able to diffuse to the phosphorescent layer because of their longer life.

In the second embodiment, preferably the thickness of the exciton generating layer is in the range of from 10 to 50 nm. In the absence of a singlet blocking layer, the exciton generating layer should be sufficiently thick that singlet excitons do not diffuse out of it, but sufficiently thin that triplet excitons do diffuse out of it.

In the device according to the second embodiment, exciton formation occurs in a recombination zone near or at the interface of the light emitting layer with the hole transport layer (HTL) (or the anode where a HTL is not present). This is because of the relative mobility of holes and electrons in the two layers as described above. Holes are injected from the anode and electrons are injected from the cathode. In the second embodiment, it is preferred that the exciton generating layer is situated on the anode side of the device and the phosphorescent layer is situated on the cathode side of the device. In this case, the recombination zone will be in the exciton generating layer. In order for the holes and electrons to combine to generate excitons, the electrons thus must pass through the phosphorescent layer to reach the recombination zone in the exciton generating layer. Therefore, the phosphorescent layer must be capable of transporting electrons.

The second embodiment is preferred.

The anode may comprise any suitable material. An indium tin oxide (ITO) anode is preferred. A layer of conducting polymer is preferably provided over the anode. Poly(ethylene dioxythiophene)/poly(styrene sulfonate) is a preferred conducting polymer.

The cathode may comprise any suitable material. The cathode may comprise a metal having a workfunction of below 3 eV, such as calcium or barium, optionally with a higher workfunction capping material such as aluminium.

The cathode may alternatively comprise a thin layer of electron injecting material such as a metal fluoride or oxide (e.g. LiF) and a metal layer (e.g. Al).

It will be understood by a person skilled in this art that care must be taken during manufacture of a multilayer device to preserve the integrity of existing layers of the device when depositing further layers. With solution processing, this may be achieved, for example, by depositing a further layer from a solvent in which the underlying layer is not soluble. Alternatively, this may be achieved by rendering the underlying layer insoluble prior to deposition of the further layer thereon. For the purposes of the present invention, the term "solution processable material/layer" encompasses both (i) a material/layer present in the finished device, which itself is soluble (thereby allowing solution processing); and (ii) a material/layer that has been rendered insoluble in the finished device after solution deposition (typically of a precursor material) during device manufacture.

A preferred solution processing technique is spin-coating for forming unpatterned devices such as lighting devices. Ink jet printing is a preferred solution processing technique for forming a pixellated, high information content display.

A further aspect of the present invention provides an illumination device (e.g. a flat illumination panel) comprising a light emitting device as defined above. Such an illumination device may be used as a backlight for a liquid crystal display.

A further aspect provides a method of making a light emitting device as defined above. In the method, preferably, the exciton generating layer and/or the phosphorescent layer is deposited by solution processing. Where present, preferably the singlet blocking layer is deposited by solution processing the present method. Also, where present, the hole transport layer preferably is deposited by solution processing in the present method.

The present invention now will be described in more detail with reference to the attached drawings, in which.

EXAMPLES

Figure 1:
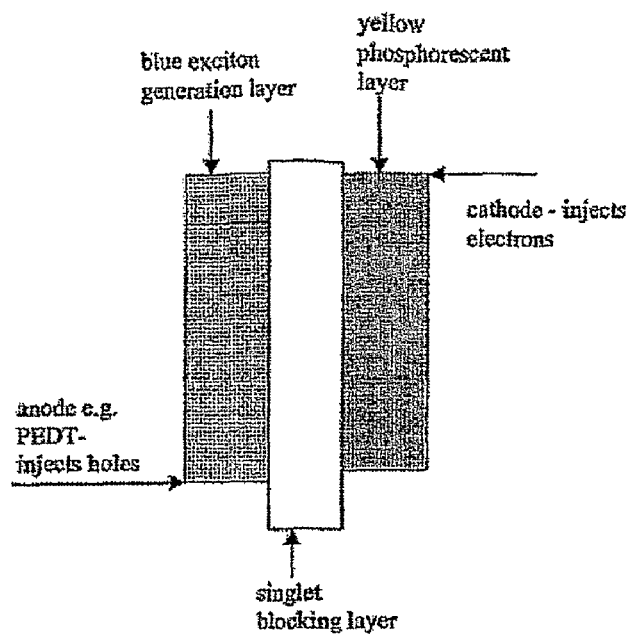
FIG. 1 shows the structure of a device according to the first embodiment of the invention.
Figure 2:
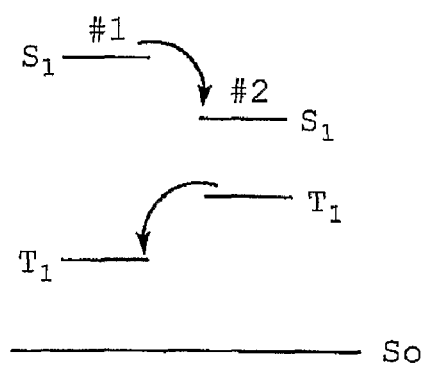
FIG. 2 shows energy of singlet (S1) and triplet (T1) excitons relative to the ground state (S0) in the exciton generating layer and the phosphorescent layer in a device according to the first embodiment of the invention. As drawn, layer #1 is the singlet blocking layer and layer #2 is the exciton generating layer.
Figure 3:
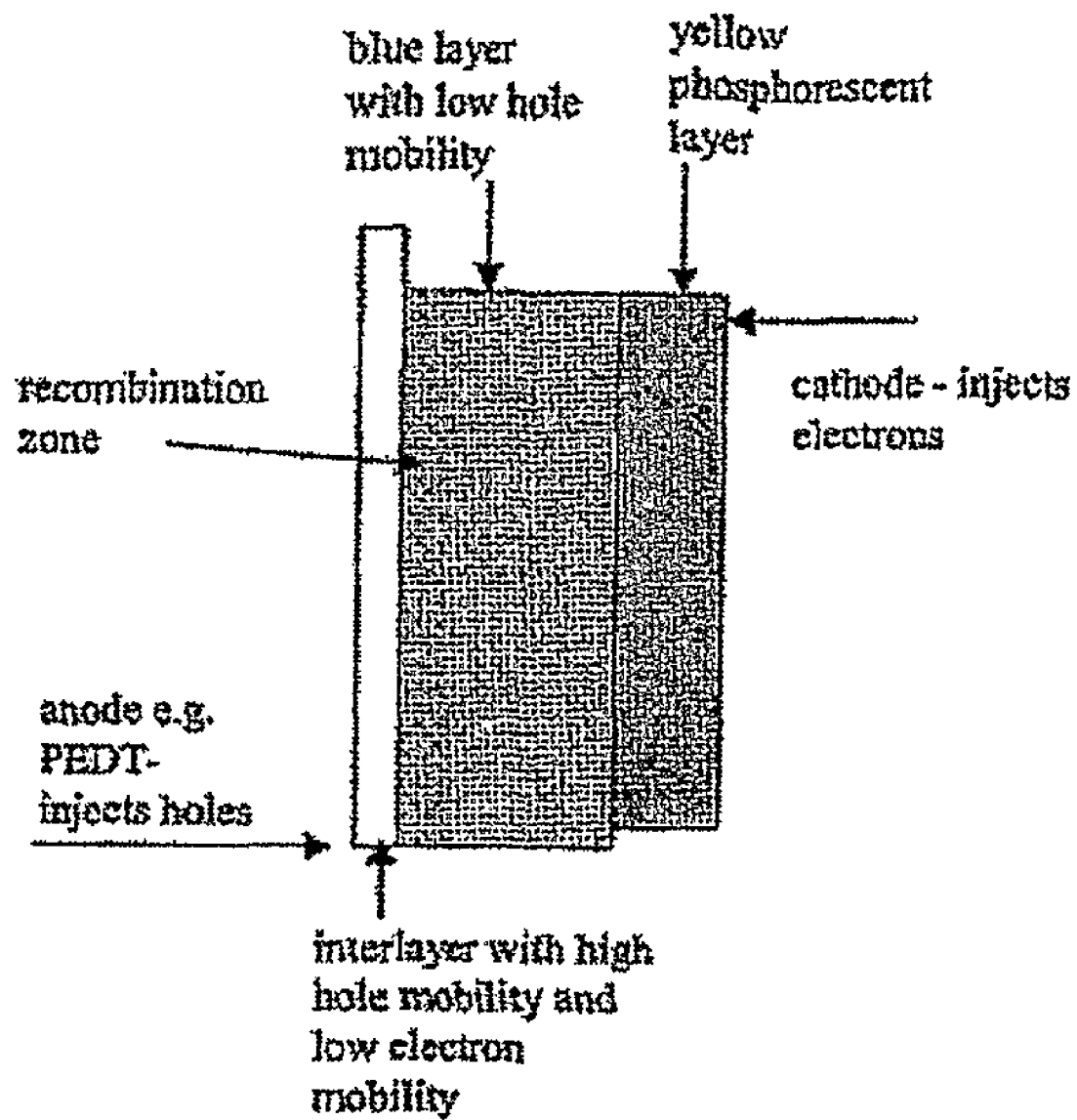
FIG. 3 shows the structure of a device according to the second embodiment of the invention.

Onto an indium tin oxide anode supported on a glass substrate (available from Applied Films, Colorado, USA) is deposited a layer of PEDOT/PSS (available from H C Starck, Leverkusen, Germany as Baytron P®) by spin-coating. A 10 nm thick layer of "F8-TFB", illustrated below and disclosed in WO 99/54385, is deposited onto the PEDOT/PSS layer by spin-coating from xylene solution and then heated at 180° C. for 1 hour as described in WO 2004/023573. Blue polymer P1, illustrated below and disclosed in WO 2003/095586, was deposited onto the F8-TFB layer to form a 25 nm thick exciton generating layer onto which was deposited by evaporation a mixture of $Bt_2Ir(acac):BCP$ in a weight ratio of 10:90 to form a 50 nm thick yellow emitting phosphorescent layer, and finally a cathode comprising a thin layer of LiF and a capping layer of aluminium was deposited over the BCP layer. The device was encapsulated by placing a metal enclosure over the device (available from Saes Getters SpA) and gluing it to the substrate to form an airtight seal.

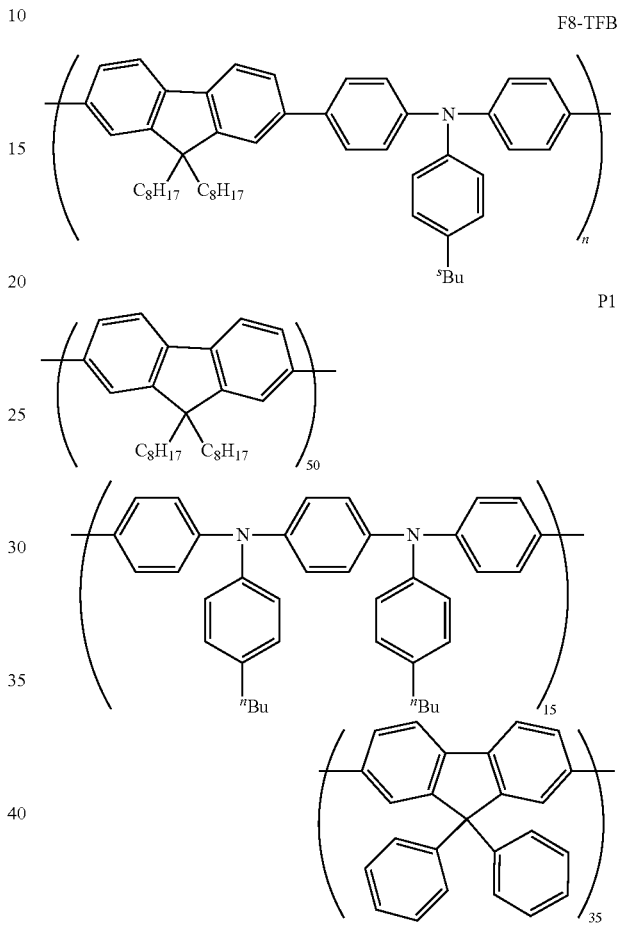

The invention claimed is:

1. A light-emitting device comprising: an anode; a cathode; and a light emitting region situated between the anode and the cathode, said light emitting region comprising an exciton generating layer and a phosphorescent layer, the exciton generating layer comprising an organic material, wherein the organic material of the exciton generating layer generates singlet and triplet excitons and emits light by fluorescent emission from the singlet excitons and the phosphorescent layer accepts the triplet excitons from the exciton generating layer and emits light by phosphorescent emission from the triplet excitons, wherein a singlet blocking layer is located between the exciton generating layer and the phosphorescent layer, wherein the singlet blocking layer comprises stilbene.

2. A device according to claim 1, wherein the device is a white light emitting device.

3. A device according to claim 2, wherein the white light is comprised of blue light and yellow light.

4. A device according to claim 1, wherein the organic material of the exciton generating layer comprises a polymer.

5. A device according to claim 1, wherein the exciton generating layer consists of a single material.

6. A device according to claim 5, wherein the organic material of the exciton generating layer consists of a blue fluorescent material.

7. A device according to claim 1, wherein the exciton generating layer is solution processable.

8. A device according to claim 1, wherein the phosphorescent layer comprises a yellow phosphorescent material.

9. A device according to claim 1, wherein the phosphorescent layer comprises a phosphorescent organic polymer or oligomer, or a low molecular weight metal complex.

10. A device according to claim 1, wherein the phosphorescent layer is solution processable.

11. A device according to claim 1, wherein the thickness of the singlet blocking layer is in the range of from 10 nm to 70 nm.

12. A device according to claim 1, wherein the singlet blocking layer is solution processable.

13. A device according to claim 1, wherein the exciton generating layer is situated on the anode side of the device and the phosphorescent layer is situated on the cathode side of the device.

14. A device according to claim 13, wherein the thickness of the exciton generating layer is in the range of from 10 nm to 50 nm.

15. A device according to claim 1, wherein the device includes a hole transport layer situated between the anode and the light emissive region.

16. An illumination device comprising a light emitting device as defined in claim 1.

* * * * *